US010677542B2

(12) United States Patent
Ziade et al.

(10) Patent No.: US 10,677,542 B2
(45) Date of Patent: Jun. 9, 2020

(54) ENHANCED THERMAL TRANSPORT ACROSS INTERFACES

(71) Applicant: Trustees of Boston University, Boston, MA (US)

(72) Inventors: Elbara O. Ziade, Albuquerque, NM (US); Aaron J. Schmidt, Boston, MA (US)

(73) Assignee: TRUSTEES OF BOSTON UNIVERSITY, Boston, MA (US)

( * ) Notice: Subject to any disclaimer, the term of this patent is extended or adjusted under 35 U.S.C. 154(b) by 0 days.

(21) Appl. No.: 16/156,165

(22) Filed: Oct. 10, 2018

(65) Prior Publication Data

US 2019/0120571 A1    Apr. 25, 2019

Related U.S. Application Data

(60) Provisional application No. 62/575,690, filed on Oct. 23, 2017.

(51) Int. Cl.
| | |
|---|---|
| *H01L 21/48* | (2006.01) |
| *H01L 21/3065* | (2006.01) |
| *F28F 13/18* | (2006.01) |
| *H01L 23/367* | (2006.01) |
| *H01L 23/373* | (2006.01) |

(52) U.S. Cl.
CPC ........ *F28F 13/185* (2013.01); *H01L 21/4871* (2013.01); *H01L 21/4878* (2013.01); *H01L 23/367* (2013.01); *H01L 23/373* (2013.01); *H01L 23/3732* (2013.01); *H01L 23/3735* (2013.01); *F28F 2255/20* (2013.01); *H01L 23/3738* (2013.01)

(58) Field of Classification Search
None
See application file for complete search history.

(56) References Cited

U.S. PATENT DOCUMENTS

| 3,670,396 A | 6/1972 | Lindberg |
| 4,710,794 A | 12/1987 | Koshino et al. |

(Continued)

OTHER PUBLICATIONS

Hopkins, "Thermal Transport across Solid Interfaces with Nanoscale Imperfections: Effects of Roughness, Disorder, Dislocations, and Bonding on Thermal Boundary Conductance," *ISRN Mechanical Engineering*, vol. 2013, 682586 (2013).

(Continued)

*Primary Examiner* — Shamim Ahmed
(74) *Attorney, Agent, or Firm* — Nutter McClellen & Fish LLP

(57) ABSTRACT

Methods and apparatus for creating an interface between a surface and a substrate, where the thermal conductivity of the substrate exceeds that of the surface. At least one of the surface and the substrate is subtractively nanostructured to create a nanostructured surface, each nanostructured surface is functionalized, and the surface is bonded to the substrate. The nanostructured surface may be functionalized using at least one of the processes of surface acid etching, oxygen plasma etching, atomic layer deposition, sputtering, e-beam deposition, and ion-beam bombardment or implantation, with or without subsequent reflow.

17 Claims, 5 Drawing Sheets
(4 of 5 Drawing Sheet(s) Filed in Color)

(56) References Cited

U.S. PATENT DOCUMENTS

| | | | |
|---|---|---|---|
| 5,290,333 A * | 3/1994 | Nied | C04B 35/62665 216/34 |
| 5,472,370 A * | 12/1995 | Malshe | B24B 37/042 257/E21.244 |
| 5,517,758 A * | 5/1996 | Nakamura | C23C 18/22 174/266 |
| 5,981,400 A * | 11/1999 | Lo | C30B 25/18 117/97 |
| 6,521,139 B1 * | 2/2003 | Kondo | C23F 1/18 216/108 |
| 7,268,081 B2 | 9/2007 | Yang | |
| 7,645,512 B1 | 1/2010 | Sammakia et al. | |
| 7,893,432 B2 | 2/2011 | Hannah et al. | |
| 8,486,280 B2 * | 7/2013 | Lee | C23C 16/0263 216/11 |
| 2004/0264136 A1 * | 12/2004 | Houle | H01L 23/373 361/704 |
| 2006/0113546 A1 * | 6/2006 | Sung | C23C 16/274 257/77 |
| 2006/0267029 A1 | 11/2006 | Li | |
| 2008/0237844 A1 * | 10/2008 | Aleksov | H01L 23/3731 257/713 |
| 2009/0050925 A1 * | 2/2009 | Kuramoto | H01L 33/486 257/100 |
| 2009/0289032 A1 * | 11/2009 | Flanagan | C08J 5/12 216/34 |
| 2010/0117108 A1 * | 5/2010 | Gaebler | B82Y 20/00 257/98 |
| 2011/0008644 A1 * | 1/2011 | Naritomi | B29C 45/14311 428/612 |
| 2012/0097638 A1 * | 4/2012 | Tong | H01L 21/0206 216/34 |
| 2014/0147609 A1 * | 5/2014 | Ren | C09D 181/06 428/36.91 |
| 2014/0174941 A1 | 6/2014 | Mardilovich et al. | |
| 2014/0272280 A1 | 9/2014 | Afzulpurkar et al. | |

OTHER PUBLICATIONS

Zhou et al., "Relationship of thermal boundary conductance to structure from an analytical model plus molecular dynamics simulations," *Phys. Rev. B*, vol. 87, 094303, (2013).

English et al., Enhancing and tuning phonon transport at vibrationally mismatched solid-solid interfaces, *Phys. Rev. B*, vol. 85, pp. 1-14 (2012).

Cross et al., "A metallization and bonding approach for high-performance carbon nanotube thermal interface materials," *Nanotechnology*, vol. 21, 445705 (2010).

Cho et al., "Improved thermal interfaces of GaN-Diamond Composite Substrates for HEMT Applications," *IEEE Trans. Components, Packaging and Manufacturing Tech.*, vol. 3, pp. 79-85 (2013).

Hopkins et al., "Effects of surface roughness and oxide layer on the thermal boundary conductance at aluminum/silicon interfaces," *2010 14th International Heat Transfer Conference*, pp. 313-19 (2010), Abstract.

Tao et al., "Interlaced, Nanostructured Interface with Graphene Buffer Layer Reduces Thermal Boundary Resistance in Nano/microelectronics Systems," *ACS Applied Materials & Interfaces*, vol. 9, pp. 989-98 (2016).

Norris et al., "Examining Interfacial Diffuse Phonon Scattering Through Transient Thermoreflectance Measurements of Thermal Boundary Conductance," *J. Heat Transfer*, vol. 131, 043207 (2009).

Lee et al., "Nanostructures Significantly Enhance Thermal Transport across Solid Interfaces," *Appl. Materials & Interfaces*, vol. 8, pp. 35505-35512 (2016).

Hu et al., "Large "near junction" thermal resistance reduction in electronics by interface nanoengineering," *Int. J. Heat & Mass Transfer*, vol. 54, pp. 5183-5191 (2011).

Park, "Enhanced Thermal Conduction through Nanostructured Interfaces," *Nanoscale & Microscale Thermophysical Engineering*, vol. 21, pp. 134-144 (Feb. 17, 2017).

USPTO, Lee W. Young, Authorized Officer, International Search Report for Application No. PCT/US18/55172, dated Jan. 7, 2019 (6 pages), together with the Written Opinion of the International Searching Authority.

* cited by examiner

*Fig. 3A* *Fig. 3B* *Fig. 3C*
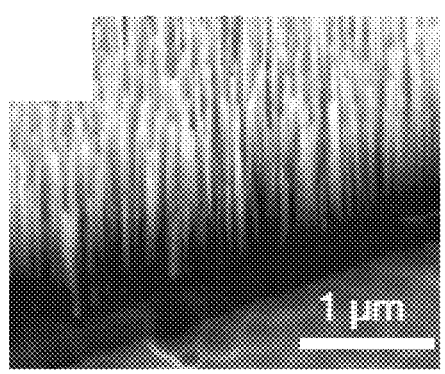 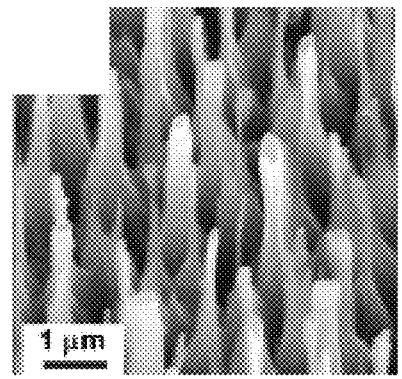 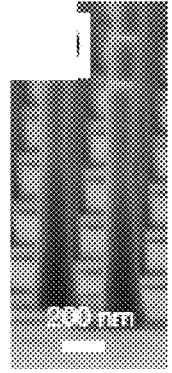
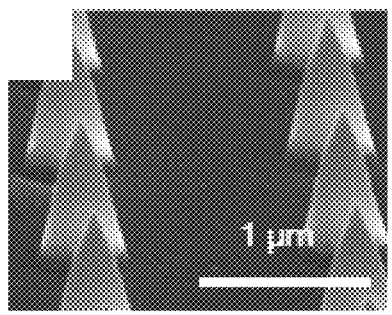 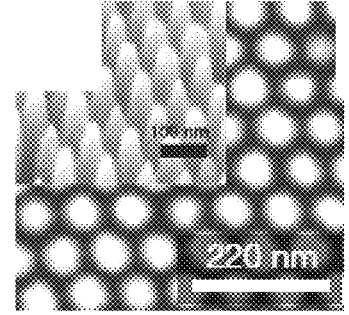 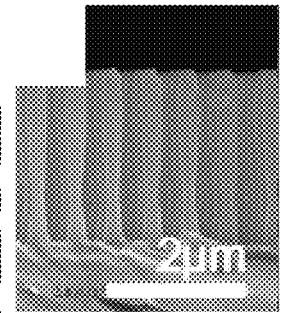
*Fig. 3D* *Fig. 3E* *Fig. 3F*
PRIOR ART Fig. 5A        Fig. 5B                    Fig. 5E
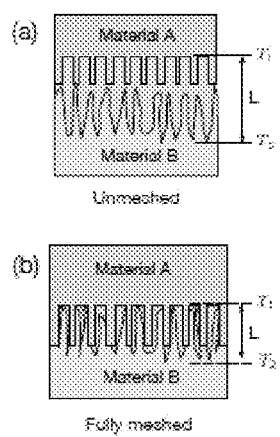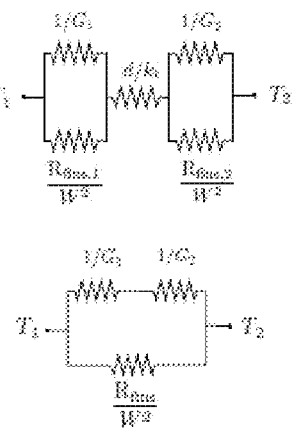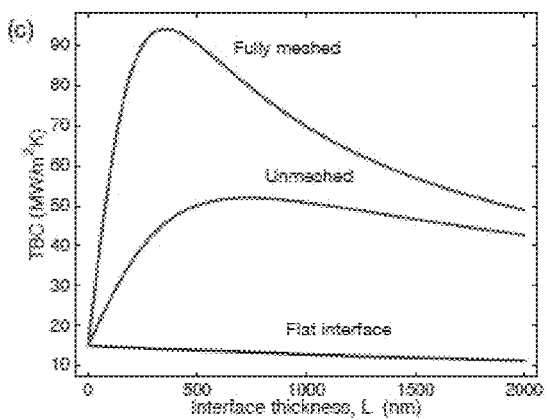
Fig. 5C        Fig. 5D Fig. 6A   Fig. 6B
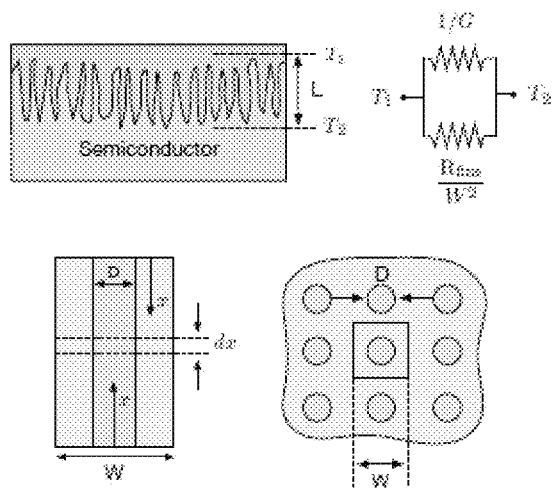
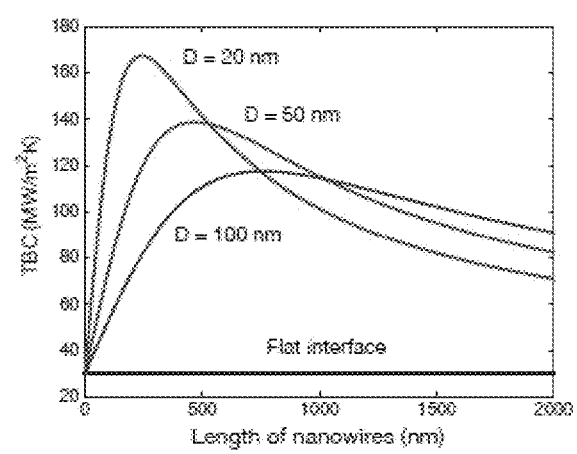
Fig. 6C   Fig. 6D   Fig. 6E

ENHANCED THERMAL TRANSPORT ACROSS INTERFACES

The present application claims priority from U.S. Provisional Application 62/575,690, filed Oct. 23, 2017, which is incorporated herein by reference.

FIELD OF INVENTION

The present invention relates to devices and methods for conducting heat between sources of heat, such as active devices, and heat-conducting substrates, and, more particularly, to management of heat conduction by interdigitated, or otherwise bonded, nanostructures.

BACKGROUND ART

For some decades, understanding and engineering the underlying role of lattice mismatch and dislocations on phonon thermal boundary conductance have been subjects of intensive research activity. As background, a wide-ranging review of knowledge in the field of thermal boundary conductance across solid interfaces, as of its writing, may be found in Hopkins, "*Thermal Transport across Solid Interfaces with Nanoscale Imperfections: Effects of Roughness, Disorder, Dislocations, and Bonding on Thermal Boundary Conductance,*" *ISRN Mechanical Engineering*, vol. 2013, 682586 (2013).

Limitations on heat transfer from devices to substrates of high thermal conductivity, however, constitute one of the primary bottlenecks in modern microelectronics engineering, particularly for transformative technologies with high commercial and environmental impact. Heat transfer at the interface between distinct materials may be characterized by the thermal boundary conductance (TBC) across the boundary. TBC is the inverse of thermal boundary resistance.

New technologies based on wide-bandgap semiconductors, such as GaN, GaAs, AlGaN, and ZnO, are poised to be disruptive in smart grid distribution, consumer cell phone networks, electric vehicle power converters, and solid state lighting. However, device performance, efficiency, and life expectancy are limited by heat removal from the semiconductor, as discussed, for example, by Chou, et al., "*Degradation of AlGaN/GaN HEMTs under elevated temperature life testing,*" *Microelectronics Reliability*, vol. 44, pp. 1033-38, (2004), which is incorporated herein by reference. For example, a 5° C. increase in temperature above the optimum operating range can decrease the lifetime of a device by half, as discussed by Stoner, et al., "*Measurements of the Kapitza conductance between diamond and several metals,*" *Phys. Rev. Lett.*, vol. 68, pp. 1563-66, (1992), which is incorporated herein by reference.

Zhou et al., "*Relationship of thermal boundary conductance to structure from an analytical model plus molecular dynamics simulations,*" *Phys. Rev. B*, vol. 87, 094303, (2013), incorporated herein by reference, found that a small amount of roughness increased TBC linearly with total interfacial area.

As an alternative to growing one material directly on another, the use of an intermediate thermal interface material (TIM) to bond two surfaces has been explored, for example, by English et al., "*Enhancing and tuning phonon transport at vibrationally mismatched solid-solid interfaces,*" *Phys. Rev. B*, vol. 85, pp. 1-14 (2012), incorporated herein by reference. While the intermediate material necessarily adds some thermal resistance, it fills any voids and can alleviate stress during thermal cycling, increasing device lifetimes. In addition, an intermediate layer can improve TBC by serving as a phonon impedance matching layer to bridge two materials with a sharp contrast in vibrational properties.

Carbon nanotube composites have been used as thermal interface materials to achieve TBCs on the order of 0.5 MW/m$^2$K, as described by Cross et al., "*A metallization and bonding approach for high-performance carbon nanotube thermal interface materials,*" *Nanotechnology*, vol. 21, 445705 (2010), incorporated herein by reference. Heat transfer limitations arise due to interfacial resistance between the carbon nanotubes. The most successful approach to date has been to use a thin adhesive layer (which might be a soft metal, such as indium, or a thin film of silicon nitride) as described by Cho et al., "*Improved thermal interfaces of GaN-Diamond Composite Substrates for HEMT Applications,*" *IEEE Trans. Components, Packaging and Manufacturing Tech.*, vol. 3, pp. 79-85 (2013), incorporated herein by reference. A flat interface of GaN bonded to diamond with indium yielded a similar TBC to direct crystal growth, on the order of 15-20 MW/m$^2$K. This method has two additional advantages: it works for a variety of materials combinations and alleviates thermal stresses at the interface. However, these TBC values still represent the critical bottleneck in the heat removal path.

The effect of nanostructured surface features on thermal conductance has been a matter of some contention, with Hopkins et al., "Effects of surface roughness and oxide layer on the thermal boundary conductance at aluminum/silicon interfaces," 2010 14*th International Heat Transfer Conference*, pp. 313-19 (2010)) finding a decrease in thermal boundary conductance with surface roughness, while simulations of Tao et al., "*Interlaced, Nanostructured Interface with Graphene Buffer Layer Reduces Thermal Boundary Resistance in Nano/microelectronics Systems,*" *ACS Applied Materials & Interfaces*, vol. 9, 989-98 (2016) concluded that nanopillar arrays would improve thermal conductance at interfaces. Tao et al. 2016 reported simulations of various longitudinal configurations of nanopillars, with features of at most tens of Angstroms in height, including various pillar densities and interval ratios. Both of the foregoing publications are included herein by reference.

It would be desirable, therefore, to have techniques for preparing surfaces so as to create an interface that provides thermal conductivity to at least the extent of existing technology and that is amenable to robust manufacture and tolerances. Such methods and apparatus are described below in accordance with embodiments of the present invention.

SUMMARY OF THE INVENTION

In accordance with embodiments of the present invention, methods and apparatus are provided for creating an interface between a first surface characterized by a first thermal conductivity and a substrate, the substrate characterized by a second thermal conductivity exceeding the thermal conductivity of the first surface. The method has steps of:

increasing the surface area of the interface by subtractively nanostructuring at least one of the first surface and the substrate to create a nanostructured surface with features having an aspect ratio of at least 1.1:1 or exceeding 10 nm in height above the respective first surface and substrate;

functionalizing each nanostructured surface; and bonding the first surface to the substrate.

In accordance with alternate embodiments of the invention, subtractively nanostructuring surface or surfaces may include forming an array of pillars on at least one of the first surface and the substrate. Moreover, both the first surface and the substrate may be nanostructured in such a manner as to form an array of pillars on each, characterized by respective pitches. The step of bonding may include meshing pillars of the first surface and pillars of the substrate, and the meshing may be incomplete. The pitches may differ by a factor between 1 and 3.

In other embodiments of the present invention, the step of subtractively nanostructuring may include one or more of the following processes:

reactive ion etching (ME); and
inductively coupled plasma etching; and
wet etching.

In further embodiments, the step of functionalizing may include at least one process chosen from the group including:

surface acid etching;
oxygen plasma etching;
atomic layer deposition;
sputtering;
e-beam deposition, with or without subsequent reflow; and
ion-beam bombardment or implantation.

The substrate may be one of a group of high thermal conductivity materials including diamond, boron nitride, silicon, AlN, GaN and SiC, and the first surface may be one of a wide-bandgap and an ultrawide-bandgap semiconductor. The wide-bandgap or ultrawide-bandgap semiconductor may be chosen from a group including binary and tertiary III-V semiconductors.

In accordance with yet further embodiments of the present invention, the step of functionalizing may include covering at least one of the surfaces with an intermediate thermal interface material, such as a metal or a metal alloy. There may also be a further step of reflowing the intermediate thermal interface after bonding the first surface to the substrate.

BRIEF DESCRIPTION OF THE DRAWINGS

The present patent or application contains at least one drawing executed in color. Copies of this patent with color drawing(s) will be provided by the Patent and Trademark Office upon request and payment of necessary fee.

The foregoing features of the invention will be more readily understood by reference to the following detailed description, taken with reference to the accompanying drawings, in which:

FIG. 3A-3C show prior art examples of high-aspect-ratio structures in diamond, while FIGS. 3D-3F show examples of high-aspect-ratio structures in GaN films.

FIGS. 5B and 5D show equivalent thermal circuits used in modeling structures depicted, respectively, in FIGS. 5A and 5C. FIG. 5E shows plots of calculated TBC for a flat interface, unmeshed, and fully meshed surface nanostructures, in accordance with embodiments of the present invention.

FIG. 6B shows an equivalent thermal circuit used in modeling the interface structure of FIG. 6A. FIGS. 6C and 6D are section and plan view of a unit cell of a periodic array used to analyze heat transfer, in accordance with an embodiment of the present invention. FIG. 6E shows plots of TBC, calculated in accordance with an embodiment of the present invention, for arrays of diamond nanowires of three different diameters embedded in indium, assuming a Kapitza conductance between diamond and indium of 30 $MW/m^2K$.

DESCRIPTION OF SPECIFIC EMBODIMENTS OF THE INVENTION

Definitions

Figures 1A, 1B:
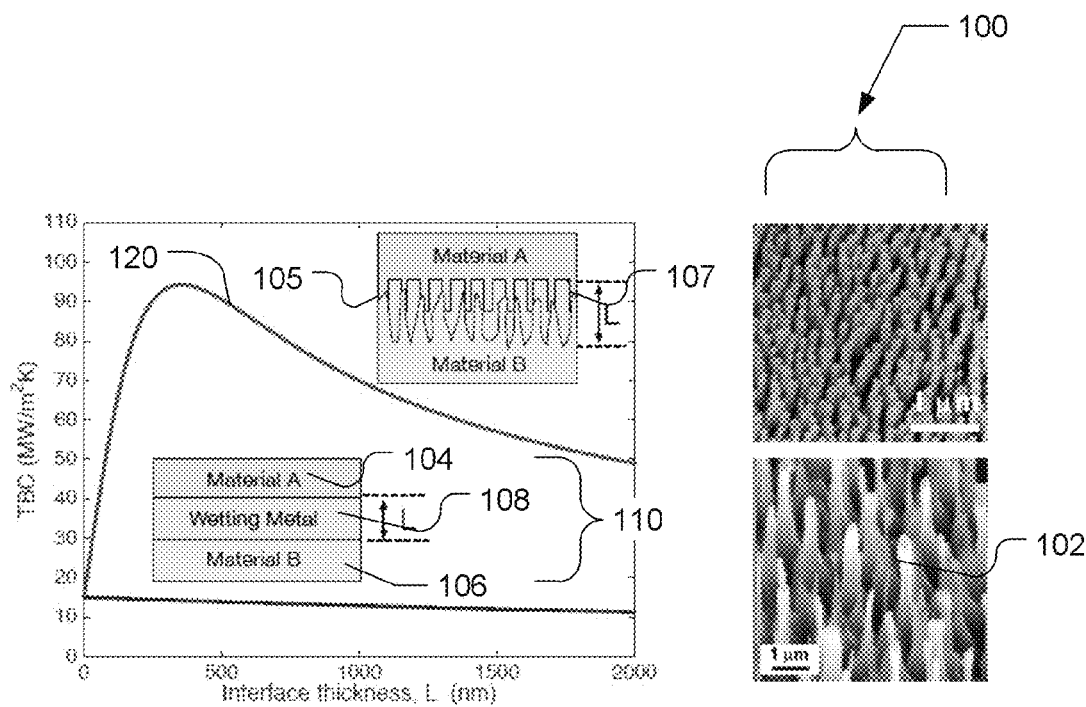
FIG. 1A shows schematics of an interface structure with a thermal interface material in accordance with an embodiment of the present invention, as well as a plot of thermal boundary conductance vs. interface thickness, as discussed below.
FIG. 1B shows SEM images of a surface nanostructured using reverse-ion etching, in accordance with embodiments of the present invention.

The following terms shall have the meanings indicated, unless otherwise dictated by context:

As used herein, "nanostructuring" a surface shall refer to creating a three-dimensional landscape at the surface, comprised of arrays of structures such as pillars, hairs, combs, or of random structures, wherein characteristic dimensions of the structures are substantially comparable to the mean-free-path of thermal carriers in the material at temperatures relevant to intended operation of the surface. "Substantially comparable," in this context, means within two orders of magnitude. In materials typical to semiconductor device fabrication, the scale of structures on a nanostructured surface is in the range of 10 nm to 10 µm. Within the scope of the present invention, nanostructuring may be performed using wet etching, or reactive ion etching (ME), or inductively coupled plasma etching, or any other technique.

As used herein, "functionalizing" a surface shall refer to inducing a surface of a material to have physical or chemical characteristics other than those found on that surface, either originally, or subsequent to further processing. Functionalization is not limited the sense in which particular chemical moieties are introduced to a surface, as the term might ordinarily be used with respect to biochemical processes. Functionalization may include, without limitation, such processes as:

surface acid etching;
oxygen plasma etching;
atomic layer deposition;
sputtering;
e-beam deposition, with or without subsequent reflow; and
ion-beam bombardment or implantation.

The term "bonding," as it refers to a pair of surfaces, means bringing the surfaces into proximity and flowing a surface layer, however accomplished, whether by heating or pressure, or otherwise, at the interface between the pair of surfaces.

"Subtractive" processing shall refer to the processing of a solid element through controlled removal of material.

"Meshing" shall denote the orientation of a first array with respect to a second array, where substantially each element of the first array lies between two nearest neighbors of the second array.

The term "interdigitated" shall describe two meshing arrays wherein each element is associated with a structure having extent in a dimension transverse to the dimensions of the array.

"Incomplete meshing" of two arrays shall denote a circumstance where substantially each element of a first array lies between two nearest neighbors of the second array, but that condition does not obtain for the second array with respect to nearest neighbors of the first array.

The terms "intermediate thermal interface material" and "thermal interface material" (or "TIM") shall refer, interchangeably, to any material, distinct in composition from that of either of two surfaces, that is introduced between the surfaces in order to enhance thermal conduction between the surfaces.

The term "aspect ratio" of a feature extending above a surface shall mean the ratio of a height (a dimension normal to the surface) of the feature to a characteristic dimension of the feature parallel to the surface.

The term "pillar" is used interchangeably with the term "high-aspect-ratio nanostructure" to denote a feature adjoin the surface of a solid whose dimension normal to the surface exceeds any dimension of the feature parallel to the surface by a ratio of at least 2:1.

A semiconductor shall be characterized as "wide-bandgap" when the bandgap between its valence band and conduction band exceeds 2 eV, and as "ultrawide-bandgap" if its bandgap exceeds 4 eV.

Methods practiced in accordance with inventive concepts described herein may advantageously improve thermal transport across the interface between technologically relevant materials scalably and transferably by nanostructuring at an interface between the materials. Additionally, the use of multiscale models of phonon transport across nanostructured interfaces and composite materials is described here for the first time.

As described in detail below, high-aspect-ratio nanostructuring of two surfaces and bonding them with an intermediate material may advantageously increase the overall TBC through two effects: The first is an increase in interfacial surface area, and the second is impedance matching through effective modification of the materials' phonon density of states (DOS).

Referring to FIGS. 1A and 1B, arrays (designated generally by numeral 100) of high-aspect-ratio nanostructures 102 are designed and fabricated on the mating surfaces 105 and 107 of two materials 104 and 106, respectively. The aspect ratio of nanostructures 102 is preferably greater than 1.1:1, and more preferably 2:1 or greater, and, therefore, nanostructures 102 are referred to herein, without limitation, as high-aspect ratio nanostructures. Materials 104 and 106 may potentially have widely different atomic structures and phonon properties, and, without loss of generality, one of materials 104 and 106 may be referred to herein as a "substrate," although that is simply an allusion to the typical application of the claimed technology, where the "substrate" is a material of relatively higher thermal conductivity than the material to be bonded to the substrate. For heuristic convenience, material 106 may be referred to herein as the substrate. The surfaces 105 and 107 are then bonded together, preferably, with a soft wetting metal 108, such as indium, forming a composite interface, designated generally by numeral 110. (The term "bonding" is as defined above.) A plot 120 of calculated TBC as a function of thickness L of wetting metal 108 is plotted in FIG. 1A.

The substrate 106 is typically one of a group of high thermal conductivity materials including diamond, cubic boron nitride and SiC, although it is not limited to those materials. In a device application, the other (typically 'active') surface is may be that of a wide- or ultrawide-bandgap semiconductor, such as a binary III-V semiconductor, or a tertiary combination such as AlGaN, however it is not so limited within the scope of the presently claimed invention.

By nanostructuring the mating surfaces 105 and 107, the thermal boundary conductance (TBC) between a metal and a high thermal conductivity material (e.g. diamond), for example, may be increased by up to five times that of a flat interface, where the term "flat," as used herein, is defined to refer to a surface that has not been nanostructured, as that term is defined above. The high-aspect-ratio nanostructures 102 enhance the surface area available for heat transfer, and also modify the phonon density of states to facilitate phonon impedance matching.

To further improve TBC, a novel and fault-tolerant approach to meshing two nanostructured surfaces is described herein. A substantial increase in TBC may be achieved, even if meshing is incomplete, and even if the nanostructures are damaged or deformed during the bonding process.

Phonon transport in individual nanostructures, such as nanowires and cones, have been studied using theoretical tools such as the Boltzmann Transport Equation (BTE) and Molecular Dynamics (MD) simulations. However, it remains computationally infeasible to extend these approaches to the scale of a realistic interface. To overcome this challenge, the present invention teaches how existing models for phonon transport in individual nanostructures may be incorporated into a larger scale continuum model for an entire physical interface.

Figures 2A, 2B, 2C, 2D, 2E:
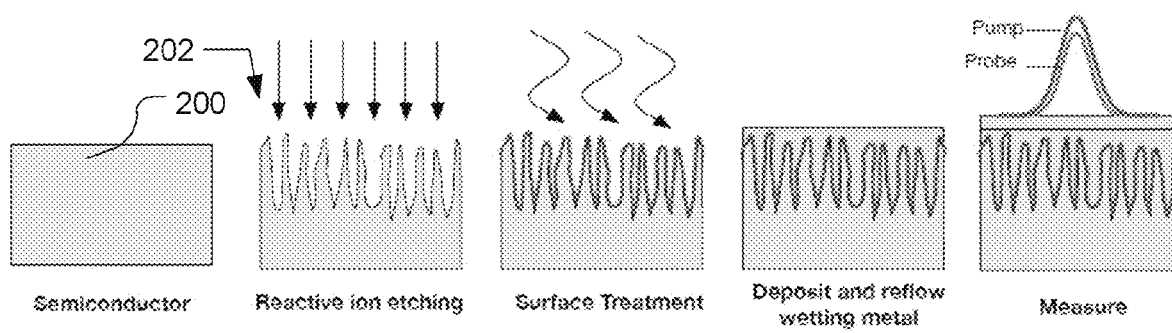
FIGS. 2A-2E depict steps in a process flow for functionalizing a nanostructured surface in accordance with embodiments of the present invention.

One or both of surfaces 105 and 107, designated by numeral 200 in FIG. 2A, is/are prepared by subtractive nanostructuring, creating, in each respective case, a nanostructured surface 202 (shown in FIG. 2B). It is possible to create high-aspect-ratio nanostructures in many materials including polycrystalline CVD diamond (as described, for example, by Zou et al., "*Fabrication of diamond nanopillars and their arrays,*" Appl. Phys. Lett., vol. 92, 053105 (2008), hereinafter "Zou 2008"), GaN (see Wang et al., "*High optical quality GaN nanopillar arrays,*" Appl. Phys. Lett., vol. 86, pp. 1-3 (2005)) and Si (see Chun-Wen et al., "*Fabrication of Size-Tunable Large Area Periodic Silicon Nanopillar Arrays with Sub-10-nm Resolution,*" J. Phys. Chem. B, vol. 107, pp. 9950-53 (2003)), where each of the foregoing papers is incorporated herein by reference.

Examples of nanostructures created in diamond are shown in FIGS. 3A-3C, and examples of nanostructures created in GaN films are shown in FIGS. 3D-3F.

Reactive ion etching (ME), inductively coupled plasma (ICP) etching or wet etching methods may be employed to achieve fine control over the density and geometry of the nanostructures 102. As practiced in the art, a masking layer is deposited to impose a regular pattern. The masking layer can be created using techniques such as nanosphere lithography (described by Guerfi et al., "High resolution HSQ nanopillar arrays with low energy electron beam lithography," *Microelectronic Engineering* vol. 110, pp. 173-76, (2013) (hereinafter, "Guerfi 2013"), incorporated herein by reference, or using metallic nanoparticles formed by annealing a sputtered metal film. Described in Zou 2008. An alternative is to use a Ni mask and inductively coupled plasma (ICP) etching. Nanosphere lithography may be employed to create more regular nanowire arrays, as described by Guerfi 2013. Wet etching may also be employed to create nanowire arrays.

In some embodiments of the invention, respective surfaces may be nanostructured with arrays characterized by pitches that may be equal or unequal, with a ratio of pitches typically in the range between 1 and 3.

At least one nanostructured surface is then functionalized, as the term is defined above. A preferred embodiment of functionalization is to apply a metallization layer (such as Ni, or, preferably, Au—Ni) to the nanostructures via Atomic Layer Deposition (ALD). Ni serves to form a barrier on diamond with respect to diffusion of an overlayer of Au. The overall metallization is typically in the range of about 1-50 nm, however the scope of the invention is not so limited.

Application of the initial metallization layer is followed by electron beam deposition of a soft metal, such as Indium or Au/Sn, that serves as a nanoscale thermal interface material (TIM). As the term is used herein, "metal" shall encompass metal alloys, as well. The metallization step facilitates complete wetting during a final reflow step that is a part of the bonding process. Au—Ni is preferred for a metallizing layer because it has been reported to improve the surface wettability of indium to diamond, Si and GaN. The TBC between Au—Ni and indium will be negligible because metal-metal contacts have TBC values as high as 3000 MW/m$^2$K.

Other functionalization processes, in the case of diamond substrates for example, include modification of the natural hydrogen termination of diamond with two surface treatments: acid treatment and oxygen plasma exposure. Acid treatment involves cleaning the diamond in a solution of 1:1 (by volume) HNO$_3$:H$_2$SO$_4$ at 200° C. for at least 30 minutes while oxygen plasma treatment is performed by exposing the diamond surface to 500 W Ar:O (75:25) plasma for 10 minutes.

Once surfaces 105 and 107 have been mated, the TIM is reflowed, as part of the bonding process, as by heating in an inert environment at 15-30° C. above the melting temperature of the metal TIM material. The inert environment prevents the formation of oxide on the wetting metal 108, which would negatively affect its wetting properties. Experimental studies and theoretical modeling based on the Wenzel relationship have shown that silicon nanopillars can be fully coated with a wetting liquid.

Figure 4:
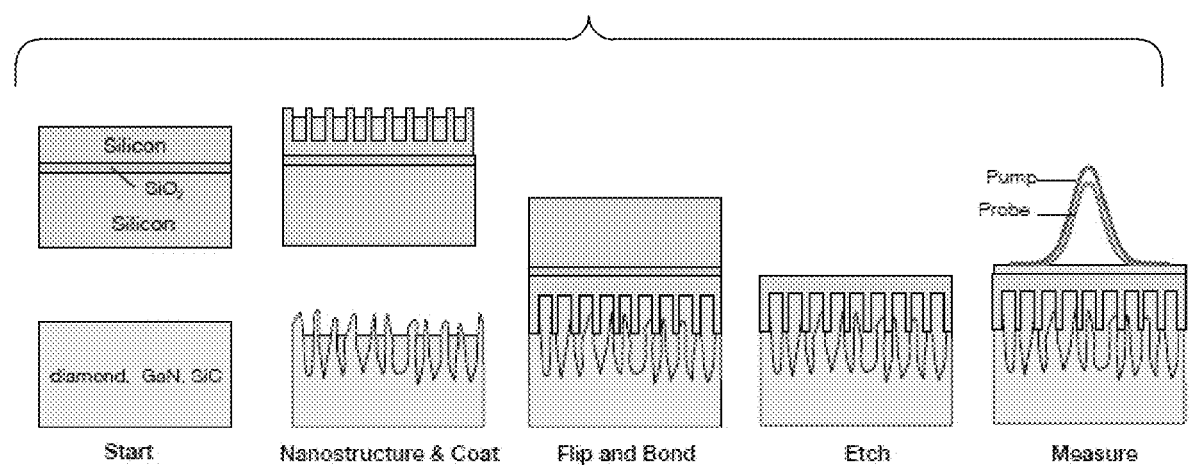
FIG. 4 depicts successive stages in the fabrication of a meshed interface in accordance with an embodiment of the present invention.

In accordance with further embodiments of the present invention, two materials are bonded using a composite nanostructured interface that maximizes TBC. Two nanostructured materials are bonded using a conformal TIM, such as indium. The bond may create a composite of silicon and diamond, or of other pairs of materials, and any combination of materials is within the scope of the present invention. The process flow (designated generally by numeral 400) for creating a composite nanostructure interface, in accordance with embodiments of the present invention, is shown in FIG. 4. After surface treatment and indium deposition 402, silicon-on-insulator (SOI) wafers are bonded to diamond.

The indium-coated wafers are exposed to a reducing environment at 200° C. for 30 minutes to remove the natural oxide of the indium film, then bonded together using a wafer bonder (available from EV Group (EVG) of St. Floriam am Inn, Austria) in a vacuum at a temperature lower than the melting point of indium to avoid gas pockets and the growth of indium oxide. Other materials are bonded in an analogous way.

As shown in FIG. 4, nanostructures may be fabricated on both the silicon and diamond surfaces, using techniques, such as RIE, discussed above, then bonded, also as described above. After indium is deposited, it is reflowed at 170° C. (14° C. above the melting point of indium), in a reducing environment. One of the main technical challenges in the practice of embodiments of the current invention is the imperfect interleaving and breakage of the nanostructures during the bonding process. Imperfect meshing between the nanostructures may lead to a significant increase in TBC.

FIGS. 5B and 5D show equivalent thermal circuits used in modeling structures depicted, respectively, in FIGS. 5A and 5C. FIG. 5E shows plots of calculated TBC for a flat interface, unmeshed, and fully meshed surface nanostructures. The problem of modeling such boundaries, and its solution in accordance with embodiments of the present invention are now discussed.

Interface Heat-Flow Modeling

Modeling heat-flow across a nanostructured interface is computationally onerous using first-principles approaches. Instead, in accordance with embodiments of the present invention, results for individual nanostructures are incorporated with a continuum model for the whole interface.

The thermal conductivity of diamond nanowires is approximated using results from nonequilibrium molecular dynamics (NEMD) simulations and first principles calculations. NEMD simulations and first principle calculations have been demonstrated, respectively, for diamond by Li et al., "*Thermal conductivity of diamond nanowires from first principles,*" Phys. Rev. B, vol. 85, pp. 1-5 (2012) and Guo et al., "*Geometry and temperature dependent thermal conductivity of diamond nanowires: A non-equilibrium molecular dynamics study,*" Physica E, vol. 43, pp. 155-60 (2010), which are incorporated herein by reference. Analogous studies have been published for silicon, as by Li et al., "*Thermal conductivity of individual silicon nanowires,*" Appl. Phys. Lett., vol. 83, pp. 2934-36 (2003), incorporated herein by reference.

The Kapitza conductance between indium and diamond may be determined experimentally from measurements on flat samples with different surface treatments and compared to variations of a diffuse mismatch model (DMM).

A diffuse mismatch model is based on the phonon density of states (DOS) and dispersion relations of two adjacent materials, and is a useful starting point for calculating the thermal conductance at an interface between the materials. At typical temperatures of electronic devices, taken here as the range between 77-500 K, a form of the DMM based on the measured heat capacity of the two materials, and derived by De Bellis et al., "*Variations of Acoustic and Diffuse Mismatch Models in Predicting Thermal-Boundary Resistance,*" J. Thermophys. & Heat Trans., vol. 14, pp. 144-50 (2000), incorporated herein by reference, yields a TBC of:

$$TBC_{DMM} = \left(\frac{\xi^{1 \to 2} v_{1D}^3}{12}\right) \rho_{c_{p,1}}(T),$$

where $\rho_{c_{p,1}}(T)$ is the volumetric heat capacity of material 1 at temperature T, $v_{i,j}$ is the phonon velocity in material i for the $j^{th}$ phonon mode, $v_{1D}$ is the average phonon velocity in material 1, and $\xi^{1 \to 2}$ is the transmission coefficient from material 1 to 2, given by $$\xi^{1 \to 2} = \left(\frac{\Sigma_j v_{1,j}^{-2} \Sigma_j v_{2,j}^{-2}}{\Sigma_j v_{1,j}^{-2} + \Sigma_j v_{2,j}^{-2}}\right) \times C,$$

where C is a correction factor based on the Debye temperature ratio of the two materials, and described in Norris et al., "*Examining Interfacial Diffuse Phonon Scattering Through*

Transient Thermoreflectance Measurements of Thermal Boundary Conductance," J. Heat Trans., vol. 131, 043207 (2009), incorporated herein by reference.

In calculations in accordance with certain embodiments of the present invention, the TIM (typically, indium) may be treated as a continuum material because of the short phonon mean free path (MFP) in metals. Though the properties of nanowires embedded in indium may be expected to be modified by surface interactions, these results are still useful for estimating the effective thermal conductivity of the nanowires.

Both analytical and numerical continuum models may be used to model the effective TBC of an interface, in accordance with embodiments of the present invention. One simplified approach that provides insight is to model a nanowire array embedded in a metal as a set of interleaved fins, as now discussed with reference to FIGS. 6A-6E. FIG. 6B shows an equivalent thermal circuit used to calculate the effective TBC of the interface, while FIGS. 6C and 6D shows the section and plane views of the unit cell in the array. Treating the heat transfer as one-dimensional within the unit cell leads to two coupled differential equations for the temperature of the diamond and indium, recognizable as usual "fin equations" of heat transfer:

$$\frac{d^2 T_1}{dx^2} = m^2(T_1 - T_2) \text{ and } \frac{d^2 T_2}{dx^2} = n^2(T_2 - T_{12})$$

where $T_i$ is the temperature in each respective material and $m^2$ and $n^2$ are "fin parameters" equal, respectively, to $$\frac{G \pi D}{k_i A_i},$$

with $i=1,2$, where G is the Kapitza conductance between the two materials (diamond and indium, say), D is the diameter of the diamond nanowire, $k_1$ is effective thermal conductivity of diamond nanowire obtained from first principles calculations, $k_2$ is the thermal conductivity of indium, $A_1 = \pi D^2/4$, and $A_2 = W^2 - A_1$, where W is the width of the unit cell. This set of coupled differential equations can be solved using boundary conditions appropriate to the geometry of the nanostructures to calculate the effective TBC of the interface.

For example, using adiabatic tip boundary conditions for each fin (suitable as a reasonable lower bound for high-aspect-ratio geometries), the solution of the coupled differential equations leads to the effective resistance of the fin pair in the unit cell:

$$R_{fins} = \frac{L}{k_1 A_1} - \frac{m^2((\cosh(aL)-1)}{a^3 \sinh aL} \cdot \left(\frac{L}{k_2 A_2} + \frac{\cosh(aL)}{k_1 A_1}\right) + \frac{m^2}{k_1 A_1} \cdot \left(\frac{\sinh(aL)}{a^3} - \frac{L}{L^2}\right) + \frac{\cosh(aL)}{a \sinh(aL)} \cdot \left(\frac{L}{k_2 A_2} + \frac{\cosh(aL)}{k_1 A_1}\right) - \frac{1}{k_1 A_1} \cdot \left(\frac{\sinh(aL)}{a}\right),$$

where $a = \sqrt{m^2 + n^2}$ (with units of inverse length).

The foregoing fin resistance may be substituted into the circuit model in FIG. 6B to calculate the effective TBC of the nanowire array. The results are plotted in FIG. 6E for three diameter nanowires, where we assume a unit cell W=2D, indium thermal conductivity of 90 W/m-K, and G=30 MW/m²K. The plot shows that a 3-5× enhancement compared to the TBC of a flat interface. More generally, the results of any first-principles calculations may be incorporated into 3D numerical models based on known surface nanostructure, as obtained by cross-sectional SEM analysis, for example, to account for potential deformation and breakage of the nanostructures.

Though the description above has focused on thermal transport across the interface between technologically relevant semiconductor materials, such as GaN, and high thermal conductivity substrates, such as diamond, the core concepts and design principles described herein are not specific to particular materials, and will be transferable to promising future technologies based on ultrawide-bandgap materials, such as heavily doped AlGaN alloys, ZnO, and many other materials.

While the description above has primarily addressed planar boundary surfaces, it is to be understood that surfaces of locally complementary finite radii of curvature are similarly encompassed within the scope of the present invention as claimed.

The embodiments of the invention described herein are intended to be merely exemplary; variations and modifications will be apparent to those skilled in the art. All such variations and modifications are intended to be within the scope of the present invention as defined in any appended claims.

We claim:

1. A method for creating an interface between a first surface characterized by a first thermal conductivity and a substrate, the substrate characterized by a second thermal conductivity exceeding the thermal conductivity of the first surface, the method comprising:
    a. providing the first surface characterized by a first thermal conductivity and the substrate, the substrate characterized by a second thermal conductivity exceeding the thermal conductivity of the first surface;
    b. increasing the surface area of at least one of the first surface and the substrate by at least one percent by subtractively nanostructuring at least one of the first surface and the substrate to create a nanostructured surface with features characterized by an aspect ratio of at least 1.1:1 above the respective first surface and substrate;
    c. functionalizing each nanostructured surface; and
    d. bonding the first surface to the substrate, wherein bonding includes bringing the first surface and the substrate into proximity with one another, and flowing a surface layer at an interface between the surface and the substrate, whether by heating, pressure or otherwise.

2. A method in accordance with claim 1, wherein subtractively nanostructuring the at least one of the first surface and the substrate includes forming features characterized by an aspect ratio of at least 2:1 above the respective first surface and substrate.

3. A method in accordance with claim 1, wherein subtractively nanostructuring the at least one of the first surface and the substrate includes forming features characterized by an aspect ratio of at least 10 nanometers.

4. A method in accordance with claim 1, wherein subtractively nanostructuring the at least one of the first surface and the substrate includes forming an array of pillars on at least one of the first surface and the substrate, the array of pillars characterized by a first pitch.

5. A method in accordance with claim 3, further comprising subtractively nanostructuring both the first surface and the substrate in such a manner as to form a first array of pillars, characterized by a first pitch, on the first surface, and a second array of pillars, characterized by a second pitch, on the substrate.

6. A method in accordance with claim 4, wherein the step of bonding includes meshing pillars of the first surface and pillars of the substrate.

7. A method in accordance with claim 6, wherein meshing of pillars of the first surface and the substrate is incomplete.

8. A method in accordance with claim 5, wherein the first pitch differs from the second pitch by a factor of between 1 and 3.

9. A method in accordance with claim 1, wherein the step of subtractively nanostructuring includes at least one of the following processes:
  reactive ion etching (RIE);
  inductively coupled plasma etching; and
  wet etching.

10. A method in accordance with claim 1, wherein the step of functionalizing at least one of the first surface and the substrate includes at least one process chosen from the group including:
  surface acid etching;
  oxygen plasma etching;
  atomic layer deposition;
  sputtering;
  e-beam deposition, with or without subsequent reflow; and
  ion-beam bombardment or implantation.

11. A method in accordance with claim 1, wherein the substrate is one of a group of high thermal conductivity materials including diamond, cubic boron nitride, AlN, GaN and SiC.

12. A method in accordance with claim 1, wherein the first surface is one of a wide-bandgap and an ultrawide-bandgap semiconductor.

13. A method in accordance with claim 11, wherein the substrate is a wide-bandgap semiconductor is chosen from a group including binary and tertiary III-V semiconductors.

14. A method in accordance with claim 1, wherein the step of functionalizing includes covering at least one of the surfaces with an intermediate thermal interface material.

15. A method in accordance with claim 14, wherein the intermediate thermal interface material is a metal.

16. A method in accordance with claim 14, wherein the intermediate thermal interface material is a metal alloy.

17. A method in accordance with claim 14, further comprising a step of reflowing the intermediate thermal interface material after bonding the first surface to the substrate.

\* \* \* \* \*